United States Patent
Rainish

[11] Patent Number: 6,144,844
[45] Date of Patent: Nov. 7, 2000

[54] METHOD AND SYSTEM FOR CONTROLLING FREQUENCY

[75] Inventor: Doron Rainish, Ramat Gan, Israel

[73] Assignee: D.S.P.C. Technologies Ltd., Givat Schmuel, Israel

[21] Appl. No.: 08/910,091

[22] Filed: Aug. 12, 1997

[30] Foreign Application Priority Data

Feb. 14, 1997 [IL] Israel ........................................ 120223

[51] Int. Cl.$^7$ .................................................... H04B 1/06
[52] U.S. Cl. ........................ 455/257; 455/192.2; 455/264
[58] Field of Search .................. 455/68, 70, 71, 455/75, 76, 77, 192.1, 192.2, 196.1, 256, 255, 257, 258, 259, 260, 264, 265, 318, 119, 125, 126; 331/17, 18; 375/344, 326

[56] References Cited

U.S. PATENT DOCUMENTS

| | | | |
|---|---|---|---|
| 4,587,483 | 5/1986 | Connell et al. | 324/76.43 |
| 4,921,467 | 5/1990 | Lax | 455/264 |
| 5,115,515 | 5/1992 | Yamamoto et al. | 455/71 |
| 5,170,492 | 12/1992 | Moller et al. | 455/70 |
| 5,335,354 | 8/1994 | Koike | 455/192.2 |
| 5,661,440 | 8/1997 | Osaka | 331/16 |
| 5,706,315 | 1/1998 | Ogoro | 375/344 |

Primary Examiner—Nguyen Vo
Assistant Examiner—Marsha D. Banks-Harold
Attorney, Agent, or Firm—Skjerven, Morrill, MacPherson, Franklin & Friel

[57] ABSTRACT

A method and system for receiving a signal in a received frequency and shifting the received frequency to become a desired frequency is provided. The system includes a controllable oscillator for generating a first internal frequency, a frequency estimating unit connected to the controllable oscillator, a first frequency shift unit, connected to the controllable oscillator and to the frequency estimating unit, for shifting the received frequency according to the first internal frequency, thereby obtaining an initially shifted frequency and a second frequency shift unit connected to the first frequency shift unit and the frequency estimating unit for shifting the initially shifted frequency. The frequency estimating unit determines a total frequency shift value from the desired frequency, the received frequency and the first internal frequency and it also determines a first frequency shift value and a second frequency shift value from the total frequency shift value. Furthermore, the frequency estimating unit provides a first frequency change command to the controllable oscillator, so as to correct the first internal frequency according to the first frequency shift value, a second frequency change command to the second frequency shift unit, so as to shift the initially shifted frequency according to the second frequency shift value.

10 Claims, 4 Drawing Sheets

METHOD AND SYSTEM FOR CONTROLLING FREQUENCY

FIELD OF THE INVENTION

The present invention relates to a method and system for controlling frequency in general and to a method and system for providing an appropriate frequency, within predetermined error limits.

BACKGROUND OF THE INVENTION

In the art, there are known methods and systems for controlling and moderating frequency. A conventional transceiver includes therein a local oscillator which, for example in radio frequency (RF) systems, is usually a frequency generating crystal. When the transceiver receives a signal in a given frequency $f_S$, it has to shift the frequency $f_S$ of the signal to a desired frequency $f_d$ by producing an internal frequency $f_{LO}$, using the local oscillator. Conventional frequency crystals are known to include a frequency shift which needs to be corrected, according to the received signal frequency $f_S$.

Reference is now made to FIGS. 1 and 2. FIG. 1 is a schematic illustration of a prior art system, generally referenced 1, for controlling the internal frequency of a transceiver. FIG. 2 is a graphic illustration of the frequency versus voltage curve, referenced of a typical voltage-controlled-oscillator (VCO).

System 1 includes a voltage-controlled-oscillator 2 (VCO), an input frequency shift unit 5 and an output frequency shift unit 7, both connected to VCO 2, and a frequency estimator 4, connected to VCO 2 and to input frequency shift unit 5, for determining the required frequency correction.

Conventionally, a demodulator 6 is connected after the input frequency shift unit 5 and a modulator 8 is connected before the output frequency shift unit 7.

A received signal provided to the input frequency unit 5, incorporates a frequency $f_S$. The VCO 2 generates an internal frequency $f_{IN}$ and provides it to the input frequency shift unit 5. The input frequency shift unit 5 produces a new signal having an intermediate frequency of $f_I$ wherein $f_I = f_S - f_{IN}$, and provides the new signal to the frequency estimating unit 4 as well as to the demodulator 6. It will be appreciated that conventional demodulators define a maximal allowed frequency difference $\Delta f_{ALLOWED}$ between $f_I$ and $f_d$, so that $|f_I - f_d| \leq \Delta f_{ALLOWED}$. A conventional oscillator oscillates at a frequency which changes due to poor manufacturing quality, temperature changes and the like so that a situation where $|f_I - f_d| > \Delta f_{ALLOWED}$ often occurs.

The frequency estimator 4 detects the signal provided by the frequency shift unit 5. If $|f_I - f_d| > \Delta f_{ALLOWED}$ then $f_I$ has to be adjusted to equal $f_d$. The frequency estimator 4 determines the frequency correction $\Delta f = f_d - f_I$, determines a respective voltage $V(\Delta f)$ and provides the voltage $V(\Delta f)$ to the VCO 2. Accordingly, the VCO 2 generates a corrected internal frequency $f_{IN}$.

It will be noted that, as long as $|f_I - f_d| > \Delta f_{ALLOWED}$, the demodulator cannot properly process the incoming signal.

The modulator 8 produces a signal for transmitting at a frequency of $f_T$ and provides the signal to the output frequency shift unit 7. The VCO 2 provides an internal transmitting frequency $f_{OUT}$ to the output frequency shift unit 7. In turn, the output frequency shift unit 7 produces a transmittable signal bearing a frequency of $f_{OUT} + f_T$ which is the transmitted signal b broadcasting frequency.

It is noted that $f_{IN}$ and $f_{OUT}$ are generated around a main frequency $f_{LO}$, generated by the local oscillator of the VCO unit 2.

Referring now to FIG. 2, when provided with a voltage at a value of $v_1$, the VCO 2 is expected to provide the respective frequency f. A conventional VCO, having an internal inaccuracy, may provide, for a given voltage value of $v_1$, a frequency in the range between $f_{MIN}$ and $f_{MAX}$. When maximum($f_{MAX} - f, f - f_{MIN}$) > $\Delta f_{ALLOWED}$, the frequency correction cannot be deemed final.

Conventionally, after several cycles of detection and correction, the intermediate frequency $f_I$ should differ from the desired frequency $f_d$ by no more than $\Delta f_{ALLOWED}$. Until then, the demodulator 6 cannot perform properly.

It will be appreciated that the modulator 8 is also dependent on the accuracy of the frequency provided thereto by the VCO 2.

SUMMARY OF THE PRESENT INVENTION

It is an object of the present invention to provide a novel method and a novel system for providing an appropriate frequency, within predetermined error limits.

According to the present invention there is thus provided a system for receiving a signal in a received frequency and shifting the received frequency to become a desired frequency, the system including a controllable oscillator for generating a first internal frequency, a frequency estimating unit connected to the controllable oscillator, a first frequency shift unit, connected to the controllable oscillator and to the frequency estimating unit, for shifting the received frequency according to the first internal frequency, thereby obtaining an initially shifted frequency and a second frequency shift unit connected to the first frequency shift unit and the frequency estimating unit for shifting the initially shifted frequency.

The frequency estimating unit determines a total frequency shift value from the desired frequency, the received frequency and the first internal frequency and it also determines a first frequency shift value and a second frequency shift value from the total frequency shift value.

Furthermore, the frequency estimating unit provides a first frequency change command to the controllable oscillator, so as to correct the first internal frequency according to the first frequency shift value, a second frequency change command to the second frequency shift unit, so as to shift the initially shifted frequency according to the second frequency shift value.

The frequency estimating unit may provides the first frequency change command to the controllable oscillator as an electrical voltage, with respect to the controllable oscillator characteristics.

The second frequency shift unit can be a hardware unit or a software unit. The second frequency shift unit may include means for performing a frequency shift by multiplying the initially shifted frequency by $e^{j2\pi\Delta f}$, wherein $\Delta f$ is the second frequency shift value.

The controllable oscillator may generates a second internal frequency, for example, for use in a combined transmitter receiver implementations a. In such a case, the system further includes a first output frequency shift unit, connected to the controllable oscillator for shifting a transmittable signal according to the second internal frequency.

For providing enhanced frequency correction according to the invention, the system further includes a second output frequency shift unit connected before the first output frequency shift unit and to the frequency estimating unit. The frequency estimating unit provides a command to the second output frequency shift unit to shift the transmittable signal according to the second frequency shift value thereby producing an initially shifted transmittable signal. Then, the first output frequency shift unit shifts the initially shifted transmittable signal according to the second internal frequency.

According to another aspect of the present invention there is provided a method for operating a system generating a controllable internal frequency $f_{IN}$, a method for shifting a signal from an initial frequency $f_S$ towards a desired frequency $f_D$ to a final frequency $f_F$, wherein $|f_D-f_F|$ is less than a predetermined allowed frequency error $f_{ALLOWED}$.

The method includes the steps of:

determining a total frequency shift value $F_{TOTAL}$ according to the internal frequency $f_{IN}$ and the initial frequency value $f_S$;

determining a first frequency shift value $\Delta f_1$ from the total frequency shift value $f_{TOTAL}$ and the predetermined allowed frequency error $f_{ALLOWED}$;

determining a second frequency shift value $\Delta f_2$ from the total frequency shift value $f_{TOTAL}$ and the first frequency shift value $\Delta f_1$;

adjusting the internal frequency $f_{IN}$ according to the first frequency shift value $\Delta f_1$ thereby shifting the initial frequency $f_S$ so as to produce a shifted initial frequency $f_{SHIFTED}$; and shifting the shifted initial frequency $f_{SHIFTED}$ according to the second frequency shift value $\Delta f_2$ thereby producing the final frequency $f_F$.

The sum of the first frequency shift value $\Delta f_1$ and the second frequency shift value $\Delta f_2$ equals the total frequency shift value $f_{TOTAL}$. The first frequency shift value $\Delta f_1$ defines a frequency error $f_{ERROR}$ which is less than the predetermined allowed frequency error $f_{ALLOWED}$. Since $\Delta f_2$ includes an insignificant frequency error, thus, according to the invention, it is guarantied that the total frequency correction equals frequency error $f_{ERROR}$.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The method of the present invention overcomes the disadvantages of the prior art by providing a combined hardware and software frequency correction.

Figure 1:
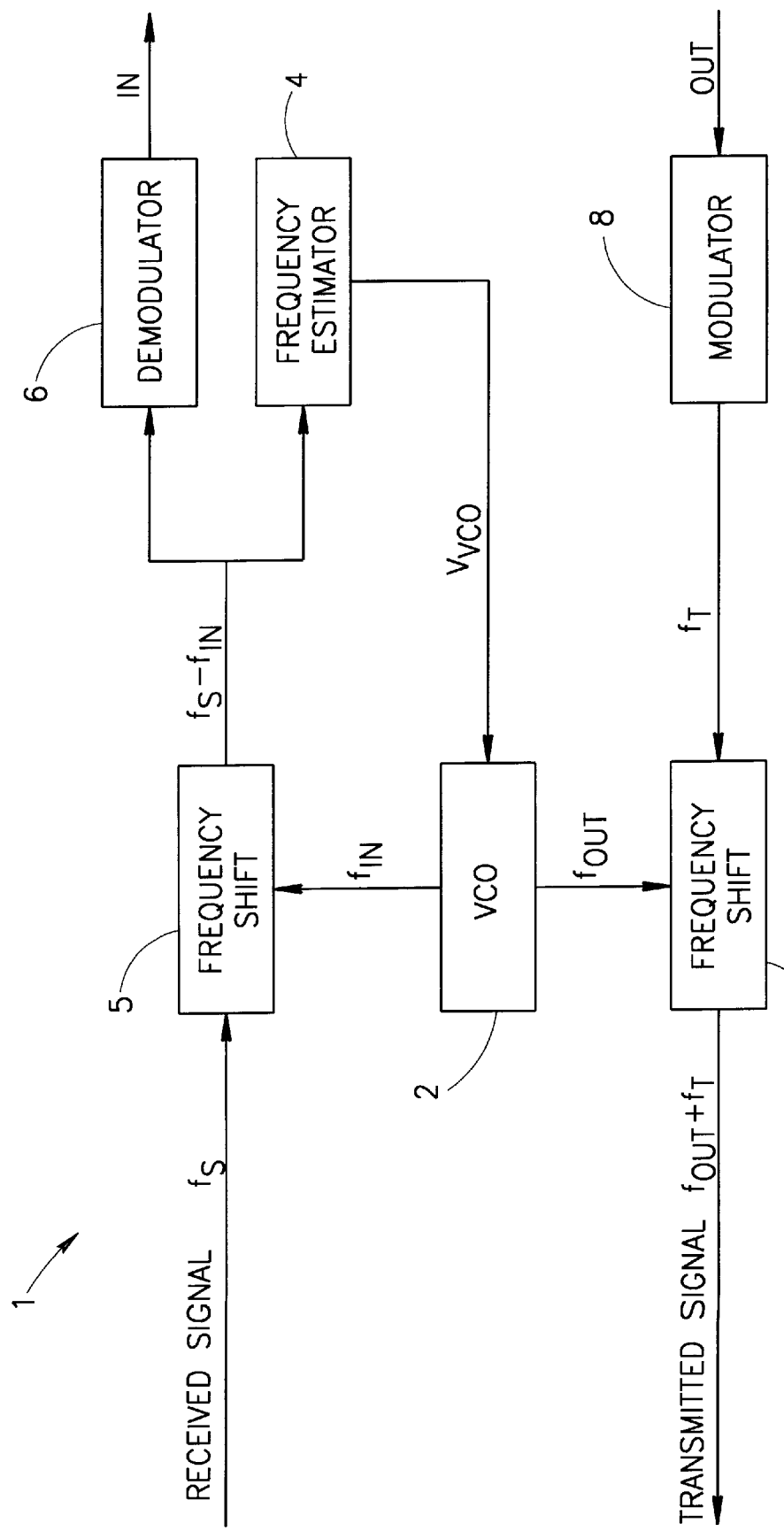
FIG. 1 is a schematic illustration of a prior art system, for controlling the internal frequency of a transceiver.
Figure 2:
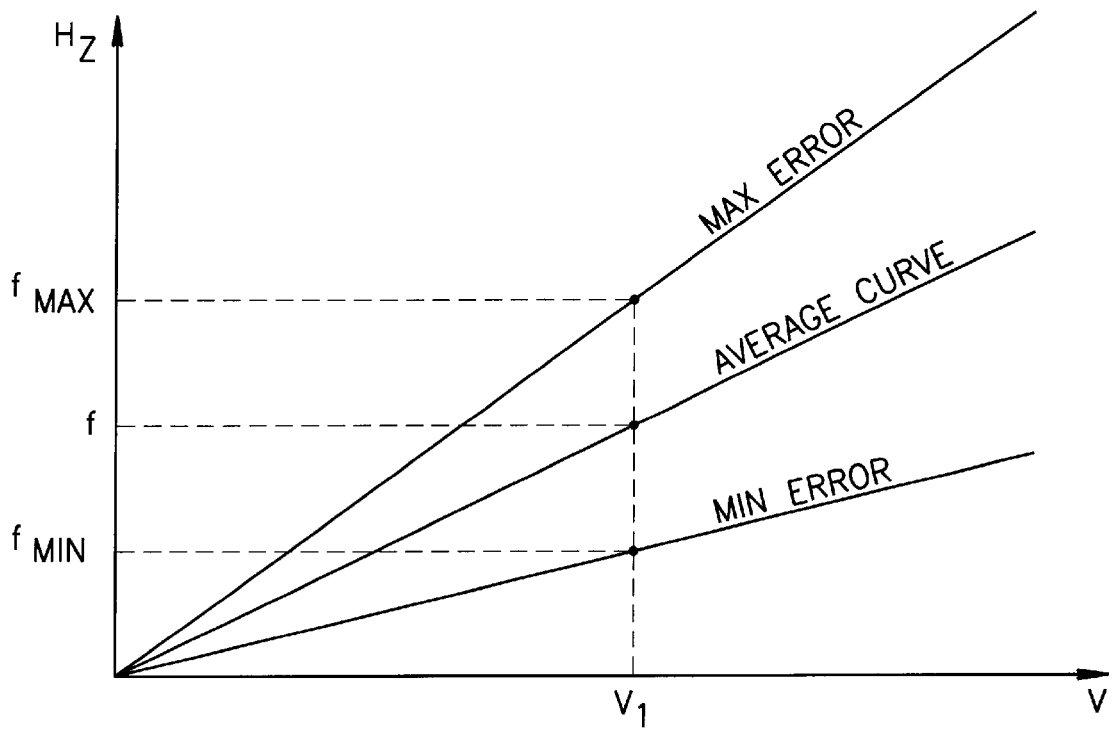
FIG. 2 is a graphic illustration of the frequency versus voltage curve, referenced of a typical voltage-controlled-oscillator (VCO)
Figure 3:
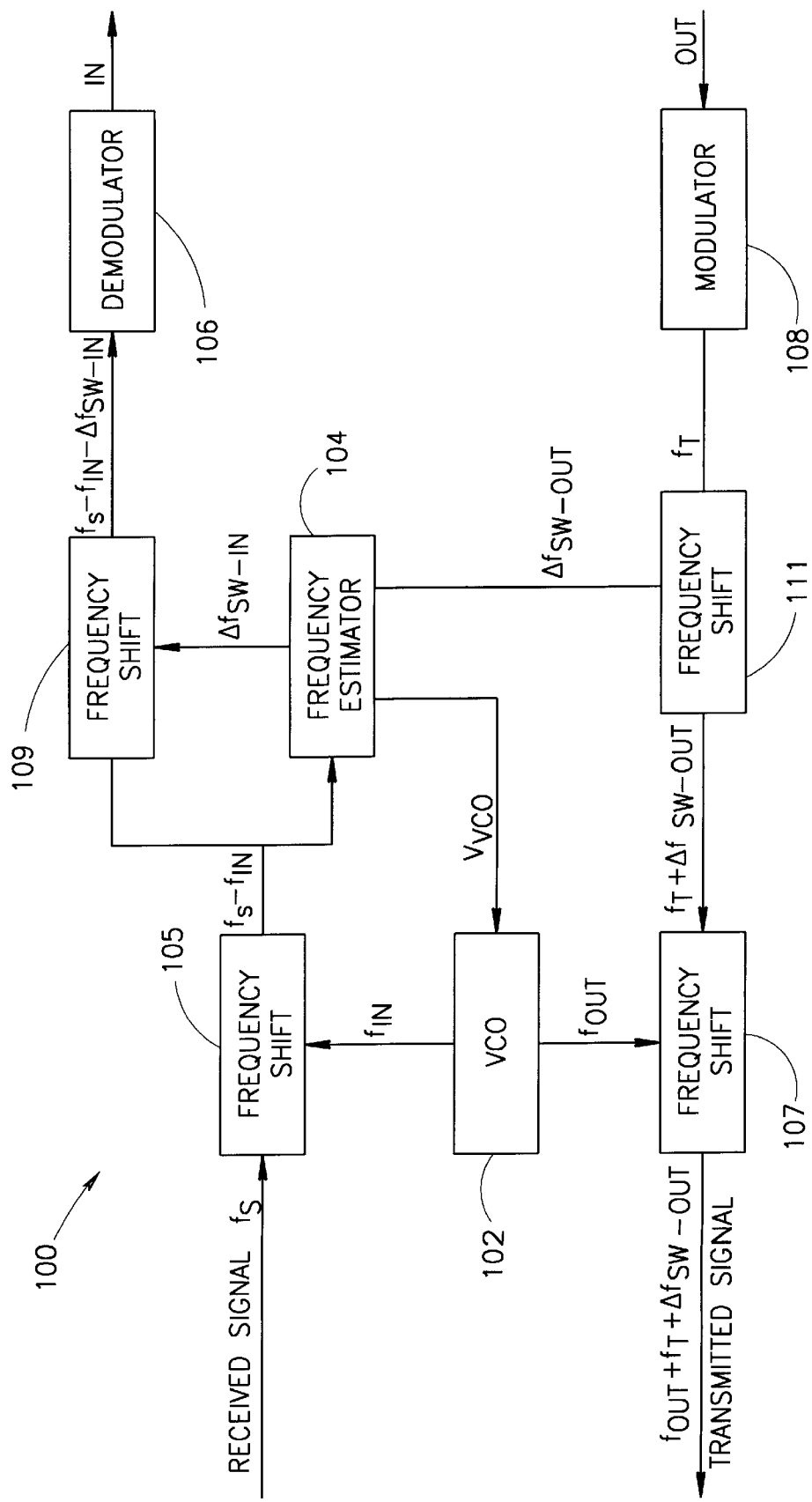
FIG. 3 is a schematic illustrating of a system, constructed and operative according to a preferred embodiment of the present invention.

Reference is now made to FIG. 3 which is a schematic illustration of a system, generally referenced 100, constructed and operative according to a preferred embodiment of the present invention.

System 100 includes a voltage-controlled-oscillator 102 (VCO), a first input frequency shift unit 105 and a first output frequency shift unit 107, both connected to VCO 102, a frequency estimator 104, connected to VCO 102 and to first input frequency shift unit 105, for determining the required frequency correction, a second input frequency shift unit 109, connected to the frequency estimator 104 and to the first input frequency shift unit 105 and a second output frequency shift unit 111, connected to the frequency estimator 104 and to the first output frequency shift unit 107.

In the present example, a demodulator 106 is connected after the second input frequency shift unit 109 and a modulator 108 is connected before the second output frequency shift unit 111.

For each given voltage value $V_1$, the VCO 102 produces a frequency $f_{LO} \pm f_{ERROR}$ due to the uncertainty incorporated in the ability of the VCO 102 to produce a predetermined frequency $f_{LO}$ when provided with a predetermined voltage $V_1$. The allowed frequency change $\Delta f_{ALLOWED}$ determines a maximum VCO frequency correction $\Delta f_{MAX}$ where $f_{ERROR}$ ($\Delta f_{MAX}$)=$\Delta f_{ALLOWED}$. For example, if $\Delta f_{ALLOWED}$=100 Hz and the maximal frequency error of the VCO 102 is ±25% then, a maximum frequency $f_{MAX}$ which equals 400 Hz guarantees that $|f_{ERROR}| \leq 100$ Hz. The present invention attempts to always provide the VCO 102 with a frequency change signal which is not greater than $\Delta f_{MAX}$ such that the maximal frequency error never exceeds $\Delta f_{ALLOWED}$.

It is noted that, in the present example, $f_{IN}$ is equal to $f_{LO}$ and $f_{OUT}$ is derived therefrom $f_{LO}$ using a frequency gap $\delta$, where $f_{OUT}=f_{LO}-\delta$.

A received signal, provided to the first input frequency unit 105, incorporates a frequency $f_S$. The VCO 102 generates a frequency $f_{IN}$ and provides the frequency $f_{IN}$ to the first input frequency shift unit 105. The first input frequency shift unit 105 produces a new signal having a frequency $f_I$ wherein $f_I=f_S-f_{IN}$ and provides the new frequency $f_I$ to the frequency estimating unit 104 as well as to the second input frequency shift unit 109.

Frequency estimating unit 104 is able to control the frequency both in hardware and in software. A hardware frequency change $\Delta f_{HW}$ is generated by providing voltage to the VCO 102. A software frequency change $\Delta f_{SW\_IN}$ is generated by providing the second input frequency shift unit 109 with a command to multiply the signal produced the first input frequency shift unit 105 by $e^{j\Delta\omega_{SW}}$, wherein $\Delta\omega_{SW}=2\pi\Delta f_{SW\_IN}$. It will be noted that the software frequency correction is considered an exact correction, bearing insignificant error.

The frequency estimator 104 detects the signal provided by the first frequency shift unit 105. If $|f_d-f_I|>\Delta f_{ALLOWED}$ then, $f_{IN}$ has to be adjusted to equal $f_{s-fd}$. The frequency estimator 104 determines the frequency correction $\Delta f=f_d-f_I$. If $|\Delta f|>f_{MAX}$ then frequency estimator 104 sets $\Delta f_{HW}$ to be $\text{sign}(\Delta f)\Delta f_{MAX}$ and $\Delta f_{SW\_IN}$ to be $\Delta f-f_{MAX}$. Otherwise, the frequency estimator 104 sets $\Delta f_{HW}$ to be $\Delta f$ and $\Delta f_{SW\_IN}$ to be zero.

The frequency estimator 104 further determines a voltage value correction $\Delta V_{vco}=\Delta V(\Delta f_{HW})$ and provides it to the VCO 102. The VCO 102 generates a corrected internal frequency $f_{IN}$.

At the same time, the frequency estimator 104 provides the value of $\Delta f_{SW\_IN}$ to the second input frequency shift unit 109. The second input frequency shift unit 109 shifts the signal received from the first input frequency shift unit 105 by $\Delta f_{SW\_IN}$. If, for example the second input frequency shift unit 109 is implemented in base-band then the frequency shift is performed by multiplying the signal received from the first input frequency shift unit 105 by $e^{j2\pi\Delta f_{SW-IN}}$.

Furthermore, the frequency estimator 104 provides a value of $\Delta f_{SW-OUT}$ to the second output frequency shift unit 111. The second output frequency shift unit 111 shifts the signal (having a frequency $f_T$) received from the modulator 108 by $\Delta f_{SW-OUT}$ and provides the resultant signal to the first output frequency shift unit 107. The first output frequency shift unit 107 receives frequency $f_{OUT}$ from the VCO 102, shifts the frequency received from the second output frequency shift unit 111 by $f_{OUT}$, so as to produce a transmitted signal bearing a frequency of $f_{OUT}+f_T+\Delta f_{SW-OUT}$.

In a conventional VCO, $f_{IN}$ and $f_{OUT}$ can be determined according to a basic frequency $f_{LO}$, wherein often $f_{IN}-f_{LO} \neq f_{LO-fOUT}$. Hence $\Delta f_{SW-OUT}$ does not necessarily equal $\Delta f_{SW-IN}$, but can be determined accordingly, since $F_{OUT}$ can be determined as $f_{OUT}(f_{IN})$.

It will be noted that a "software" frequency correction according to the present invention can be implemented using hardware means, for example, by providing a hardware multiplication unit followed by a low pass filter.

It will be noted that, according to the present invention, the total frequency correction provided to the demodulator 106 is equal to $\Delta f_{SW-IN}+\Delta f_{HW}$, with an error $f_{ERROR}$ which is no greater than $\Delta f_{ALLOWED}$. Thus, the second input frequency shift unit 109 provides a signal to the demodulator 106 which withstands the predetermined frequency error limitations.

The same applies to the transmitted signal, provided by the first output frequency unit, which also includes an error $f_{ERROR}$ which is not greater than $\Delta f_{ALLOWED}$.

The result is that the system 100 is operative to transmit and receive according to fine tuned frequencies, within predetermined frequency error limitations, as soon as frequency estimator 102 provides $\Delta f_{SW-IN}$ and $\Delta f_{SW-OUT}$ for the first time.

It will be appreciated that, in conventional systems this is not possible until $f_{IN}$ has stabilized within the error limitations which typically requires a few correction cycles and takes a significant amount of time.

After the corrected internal frequency $f_{IN}$ has stabilized, the system 100 repeats the above operations until $f_{IN}$ is corrected and stabilized whereas $\Delta f \leq \Delta f_{ALLOWED}$.

Figure 4:
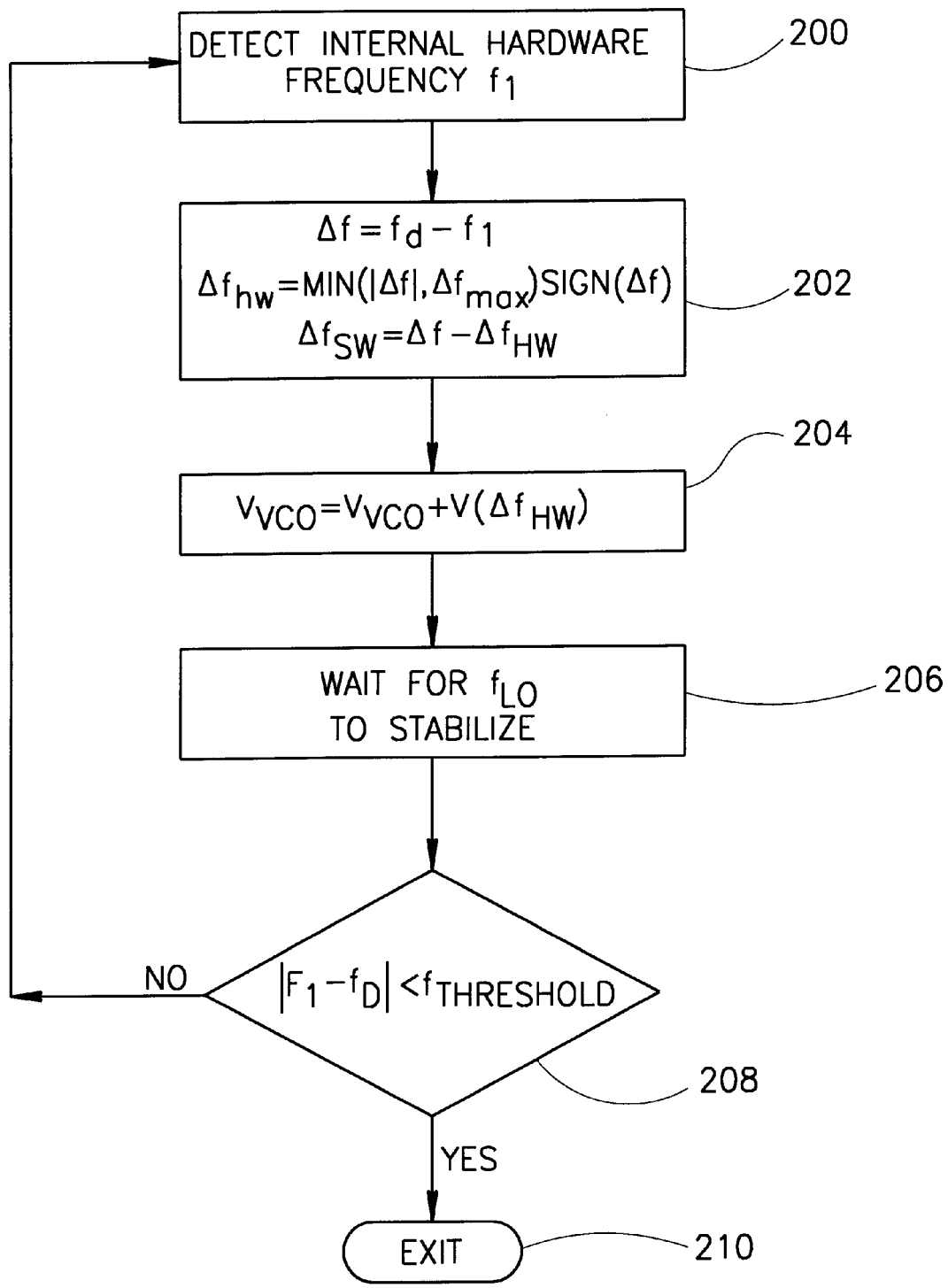
FIG. 4 is a schematic illustrating of a method for operating the system of FIG. 3, operative according to another preferred embodiment of the present invention.

Reference is now made to FIG. 4 which is a schematic illustration of a method for operating system 100, operative according to another preferred embodiment of the present invention.

In step 200, the system detects the internal hardware frequency $f_I$, provided by the local oscillator, and the received signal frequency. Then, the system proceeds to step 202.

In step 202, the system 100 determines the following values and proceeds to step 204:

the required frequency correction value $\Delta f$ wherein $\Delta f = f_d - f_I$;

the hardware frequency correction value $\Delta f_{HW}$ wherein $\Delta f_{HW}=\text{minimum}(|\Delta f|, \Delta f_{MAX})\text{sign}(\Delta f)$. $\Delta f_{MAX}$ is the maximal value of the VCO frequency which provides a frequency error no greater than the allowed frequency shift $\Delta f_{ALLOWED}$. $\Delta f_{ALLOWED}$ may be determined by the utilized communication standard, the construction of the transceiver and the like; and the software frequency correction value $\Delta f_{SW}$, wherein $\Delta f_{SW}=\Delta f - \Delta f_{HW}$.

In step 204, the system 100 determines a voltage value $V_{vco}$ wherein $V_{vco}=V_{vco}+V(\Delta f_{HW})$, provides the new value of $V_{vco}$ to the VCO 102 and proceeds to step 206.

In step 206, the system 100 waits for $f_{LO}$ to stabilize. It will be appreciated that until $f_{LO}$ is stabilized, it is virtually imposible to detect any effect of $V_{vco}$ on $f_{LO}$. After $f_{LO}$ is stabilized, the system 100 proceeds to step 208.

In step 208, if $|f_I - f_D| < \Delta f_{THRESHOLD}$, then the system 100 proceeds to step 210. Otherwise, the system proceeds back to step 200 to repeat the operation.

It will be appreciated by persons skilled in the art that the present invention is not limited to what has been particularly shown and described hereinabove. Rather the scope of the present invention is defined only by the claims which follow.

I claim:

1. A system for receiving a signal in a received frequency and shifting the received frequency to become a desired frequency, the system comprising:

a. a controllable oscillator for generating a first internal frequency, b. a frequency estimating unit connected to said controllable oscillator, c. a first frequency shift unit, connected to said controllable oscillator and to said frequency estimating unit, for shifting said received frequency according to said first internal frequency, thereby obtaining an initially shifted frequency; and d. a second frequency shift unit connected to said first frequency shift unit and said frequency estimating unit for shifting said initially shifted frequency, e. said frequency estimating unit including:

f. means for determining a total frequency shift value from said desired frequency, said received frequency and said first internal frequency;

g. means for determining a first frequency shift value and a second frequency shift value from said total frequency shift value, h. means for providing a first frequency change command to said controllable oscillator, so as to correct said first internal frequency according to said first frequency shift value, and i. means for providing a second frequency change command to said second frequency shift unit, so as to shift said initially shifted frequency according to said second frequency shift value.

2. A system according to claim 1 wherein said frequency estimating unit provides said first frequency change command to said controllable oscillator as an electrical voltage.

3. A system according to claim 1 wherein said second frequency shift unit is a hardware unit.

4. A system according to claim 1 wherein said second frequency shift unit is a software unit.

5. A system according to claim 1 wherein said second frequency shift unit includes means for performing a frequency shift by multiplying said initially shifted frequency by $e^{j2\pi\Delta f}$, wherein $\Delta f$ is said second frequency shift value.

6. A system according to claim 1 wherein said controllable oscillator generates a second internal frequency, the system further comprising a first output frequency shift unit, connected to said controllable oscillator for shifting a transmittable signal according to said second internal frequency.

7. A system according to claim 6 further comprising a second output frequency shift unit connected before said first output frequency shift unit and to said frequency estimating unit, wherein said frequency estimating unit provides a command to said second output frequency shift unit to shift said transmittable signal according to said second frequency shift value thereby producing an initially shifted transmittable signal, and wherein said first output frequency shift unit shifts said initially shifted transmittable signal according to said second internal frequency.

8. In a system generating a controllable internal frequency $f_{IN}$, a method for shifting a signal from an initial frequency $f_S$ towards a desired frequency $f_D$ to a final frequency $f_F$, wherein $|f_D-f_F|$ is less than a predetermined allowed frequency error $f_{ALLOWED}$, the method comprising the steps of:

a. determining a total frequency shift value $f_{TOTAL}$ according to said internal frequency $f_{IN}$ and said initial frequency value $f_S$;

b. determining a first frequency shift value $\Delta f_1$ from said total frequency shift value $f_{TOTAL}$ and said predetermined allowed frequency error $f_{ALLOWED}$;

c. determining a second frequency shift value $\Delta f_2$ from said total frequency shift value $f_{TOTAL}$ and said first frequency shift value $\Delta f_1$;

d. adjusting said internal frequency $f_{IN}$ according to said first frequency shift value $\Delta f_1$ thereby shifting said initial frequency $f_S$ so as to produce a shifted initial frequency $f_{SHIFTED}$; and e. shifting said shifted initial frequency $f_{SHIFTED}$ according to said second frequency shift value $\Delta f_2$ thereby producing said final frequency $f_F$.

9. A method according to claim 8 wherein the sum of said first frequency shift value $\Delta f_1$ and said second frequency shift value $\Delta f_2$ equals said total frequency shift value $f_{TOTAL}$.

10. A method according to claim 8 wherein said first frequency shift value $\Delta f_1$ defines a frequency error $f_{ERROR}$ which is less than said predetermined allowed frequency error $f_{ALLOWED}$.

* * * * *